(12) United States Patent
Kim et al.

(10) Patent No.: US 12,094,992 B2
(45) Date of Patent: Sep. 17, 2024

(54) UNIT CELL, SOLAR CELL COMPRISING SAME, AND METHOD FOR MANUFACTURING SOLAR CELL

(71) Applicant: JUSUNG ENGINEERING CO., LTD., Gwangju-si (KR)

(72) Inventors: JungBae Kim, Gwangju-si (KR); JunYoung Kang, Gwangju-si (KR); HyangJu Mun, Gwangju-si (KR); SeonKi Min, Gwangju-si (KR); JeongHo Seo, Gwangju-si (KR); WonSuk Shin, Gwangju-si (KR); HyunKyo Shin, Gwangju-si (KR); YoungTae Yoon, Gwangju-si (KR); KyoungJin Lim, Gwangju-si (KR)

(73) Assignee: JUSUNG ENGINEERING CO., LTD (KR)

( * ) Notice: Subject to any disclaimer, the term of this patent is extended or adjusted under 35 U.S.C. 154(b) by 41 days.

(21) Appl. No.: 17/641,432

(22) PCT Filed: Sep. 25, 2020

(86) PCT No.: PCT/KR2020/013035
§ 371 (c)(1),
(2) Date: Mar. 8, 2022

(87) PCT Pub. No.: WO2021/075756
PCT Pub. Date: Apr. 22, 2021

(65) Prior Publication Data
US 2022/0302332 A1    Sep. 22, 2022

(30) Foreign Application Priority Data
Oct. 18, 2019   (KR) ........................ 10-2019-0129880

(51) Int. Cl.
*H01L 31/05* (2014.01)
*H01L 31/0224* (2006.01)
*H01L 31/18* (2006.01)

(52) U.S. Cl.
CPC .. *H01L 31/0516* (2013.01); *H01L 31/022441* (2013.01); *H01L 31/186* (2013.01)

(58) Field of Classification Search
CPC ........... H01L 31/186; H01L 31/022425; H01L 31/0516; H01L 31/0512; H01L 31/0508; H01L 31/0504
See application file for complete search history.

(56) References Cited

U.S. PATENT DOCUMENTS

2007/0089780 A1  4/2007 Geyer et al.
2012/0325282 A1  12/2012 Snow et al.
(Continued)

FOREIGN PATENT DOCUMENTS

CN   106531829 A  *  9/2017 ..... H01L 31/022433
CN   108172648 A     6/2018
(Continued)

OTHER PUBLICATIONS

International Search Report for PCT/KR2020/013035, mailed Dec. 30, 2020.
(Continued)

*Primary Examiner* — Andrew J Golden
(74) *Attorney, Agent, or Firm* — Renaissance IP Law Group LLP (57) ABSTRACT

The present inventive concept relates to a solar cell, a unit cell included in the solar cell, and a method for manufacturing the solar cell, the solar cell comprising: a first unit cell manufactured using any one piece from among a plurality of pieces formed by separating a mother substrate; and a second unit cell coupled to the first unit cell, wherein the first
(Continued)

unit cell comprises a first cell electrode provided on a first unit substrate and having conductivity, the second unit cell comprises a second cell electrode provided on a second unit substrate and having conductivity, and the second cell electrode and the first cell electrode are bonded to each other without a bonding material to couple the second unit cell to the first unit cell.

13 Claims, 9 Drawing Sheets

(56) References Cited

U.S. PATENT DOCUMENTS

| | | | | |
|---|---|---|---|---|
| 2013/0206213 A1* | 8/2013 | He | | H01L 31/0504 |
| | | | | 438/73 |
| 2015/0349190 A1 | 12/2015 | Morad et al. | | |
| 2016/0163912 A1* | 6/2016 | Gonzalez | | H01L 31/188 |
| | | | | 118/712 |
| 2016/0163914 A1 | 6/2016 | Gonzalez et al. | | |
| 2017/0301801 A1* | 10/2017 | Nguyen | | H01L 31/1804 |
| 2019/0013428 A1* | 1/2019 | Shi | | H01L 31/0504 |
| 2019/0019909 A1* | 1/2019 | Nadimpally | | H01L 31/0504 |
| 2019/0081198 A1* | 3/2019 | Morad | | H01L 31/0508 |
| 2019/0355859 A1* | 11/2019 | Zheng | | H01L 31/0516 |
| 2019/0386164 A1* | 12/2019 | Shi | | H01L 31/0512 |

FOREIGN PATENT DOCUMENTS

| | | |
|---|---|---|
| CN | 108899387 A | 11/2018 |
| CN | 109287132 A | 1/2019 |
| CN | 208706668 U | 4/2019 |
| CN | 110190145 A | 8/2019 |
| CN | 110212048 A | 9/2019 |
| JP | H06140651 A | 5/1994 |
| JP | 2011086671 A | 4/2011 |
| JP | 2015534288 A | 11/2015 |
| JP | 2017517145 A | 6/2017 |
| JP | 2019004135 A | 1/2019 |
| JP | 2019501540 A | 1/2019 |
| KR | 20120126224 A | 11/2012 |
| KR | 20150084891 | 7/2015 |
| KR | 20180053993 A | 5/2018 |
| KR | 20190032864 A | 3/2019 |

OTHER PUBLICATIONS

European Extended Search Report for Application No. 20876244.3, mailed Oct. 12, 2023.

* cited by examiner

UNIT CELL, SOLAR CELL COMPRISING SAME, AND METHOD FOR MANUFACTURING SOLAR CELL

TECHNICAL FIELD

The present inventive concept relates to a solar cell and relates to a solar cell where a wafer type solar cell is combined with a thin film type solar cell.

BACKGROUND ART

Solar cells are devices that convert light energy into electrical energy, based on a characteristic of a semiconductor.

The solar cells have a PN junction structure where a positive (P)-type semiconductor and a negative (N)-type semiconductor are joined to each other. When sunlight is incident on a solar cell having the PN junction structure, a hole and an electron are generated in the semiconductors by energy of the incident sunlight. At this time, due to an electric field which is generated in a PN junction, the hole (+) moves to the P-type semiconductor, and the electron (−) moves to the N-type semiconductor, thereby generating an electric potential to produce power.

The solar cells may be categorized into thin film type solar cells and wafer type solar cells.

The wafer type solar cells are solar cells which are manufactured by using, as a substrate, a semiconductor material such as a silicon wafer, and the thin film type solar cells are solar cells which are manufactured by forming, as a thin film type, a semiconductor on a substrate such as glass.

The wafer type solar cells have an advantage which is better in efficiency than the thin film type solar cells, but the thin film type solar cells have an advantage where the manufacturing cost is reduced compared to the wafer type solar cells.

Therefore, a solar cell where the wafer type solar cell is combined with the thin film type solar cell has been proposed. Hereinafter, a related art solar cell will be described with reference to the drawing.

A method of manufacturing a solar cell according to the related art includes the following process.

First, a process of preparing a substrate with a plurality of division parts formed therein is performed. The division parts are for dividing the substrate into a plurality of pieces.

Subsequently, a process of forming a one-surface electrode on one surface of the substrate is performed, and the one-surface electrode is cured.

Subsequently, a process of forming an other-surface electrode on the other surface of the substrate is performed, and the other-surface electrode is cured. Therefore, a base substrate with the one-surface electrode and the other-surface electrode formed thereon is manufactured.

Subsequently, a process of distributing a bonding material onto the other-surface electrode is performed. The bonding material may be a material having a bonding force which enables separated pieces to be bonded to one another.

Subsequently, a process of dividing the substrate into a plurality of pieces by using the division parts is performed. Accordingly, the base substrate may be separated into a plurality of unit cells.

Subsequently, a process of bonding the plurality of unit cells by using the bonding material is performed, and bonded unit cells are cured. Accordingly, a solar cell is manufactured.

Here, the solar cell according to the related art is implemented so that the unit cells are bonded to one another by the bonding material. Due to this, because a generated power should pass through the bonding material in a process where the generated power flows through the unit cells, the solar cell according to the related art has a problem where the power generating efficiency of the solar cell is reduced by a resistance of the bonding material.

DISCLOSURE

Technical Problem

The present inventive concept is devised to solve the above-described problems and relates to a unit cell, a solar cell including the same, and a method of manufacturing the solar cell, which may decrease the degree of reduction in power generating efficiency of the solar cell caused by a resistance of a bonding material.

Technical Solution

The present inventive concept may include the following elements, for solving the above-described technical problem.

A method of manufacturing a solar cell according to the present inventive concept may include: a substrate preparing process of preparing a substrate where a plurality of division parts for dividing the substrate into a plurality of pieces are formed; a first electrode forming process of forming a plurality of first base electrodes having conductivity on one surface of the substrate; a first curing process of curing the first base electrode; a second electrode forming process of forming a plurality of second base electrodes, having conductivity and an uncured state, on the other surface of the substrate; a division process of dividing the substrate into a plurality of pieces through the division parts to form a plurality of unit cells; and a bonding process of bonding the unit cells through the second base electrode having an uncured state.

A solar cell according to the present inventive concept may include: a first unit cell manufactured by using one of a plurality of pieces formed by dividing a base substrate; and a second unit cell coupled to the first unit cell. The first unit cell may include a first cell electrode formed on a first unit substrate to have conductivity. The second unit cell may include a second cell electrode formed on a second unit substrate to have conductivity. The second cell electrode and the first cell electrode may be bonded to each other without a bonding material, thereby coupling the second unit cell to the first unit cell.

A solar cell according to the present inventive concept may include: a first unit cell manufactured by using one of a plurality of pieces formed by dividing a base substrate; and a second unit cell coupled to the first unit cell. The first unit cell may include a first cell electrode formed on a first unit substrate to have conductivity. The second unit cell may include a second cell electrode formed on a second unit substrate to have conductivity. The second cell electrode and the first cell electrode may be bonded to each other to couple the second unit cell to the first unit cell.

A unit cell according to the present inventive concept may include: a unit substrate manufactured by using one of a plurality of pieces formed by dividing a base substrate; and a cell electrode formed on the unit substrate to have conductivity. The cell electrode may include a lower cell electrode and an upper cell electrode respectively formed on one surface and the other surface of the unit substrate. One of the upper cell electrode and the lower cell electrode may be formed in an uncured state.

Advantageous Effect

According to the present inventive concept, the following effects are obtained.

The present inventive concept may be implemented so that a series of process of distributing and injecting a bonding material is omitted, and thus, may decrease a time for manufacturing a solar cell.

The present inventive concept may be implemented to fundamentally prevent the power generating efficiency of the solar cell from being reduced by the resistance of the bonding material, thereby enhancing the quality of a finished solar cell.

MODE FOR INVENTION

Advantages and features of the present inventive concept, and implementation methods thereof will be clarified through following embodiments described with reference to the accompanying drawings. The present inventive concept may, however, be embodied in different forms and should not be construed as limited to the embodiments set forth herein. Rather, these embodiments are provided so that present inventive concept will be thorough and complete, and will fully convey the scope of the present inventive concept to those skilled in the art. Furthermore, the present inventive concept is only defined by scopes of claims.

A shape, a size, a ratio, an angle, and a number disclosed in the drawings for describing embodiments of the present inventive concept are merely an example, and thus, the present inventive concept is not limited to the illustrated details. Like reference numerals refer to like elements throughout. In the following description, when the detailed description of the relevant known technology is determined to unnecessarily obscure the important point of the present inventive concept, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~' a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present inventive concept. Features of various embodiments of the present inventive concept may be partially or overall coupled to or combined with each other, and may be variously inter-operated with each other and driven technically as those skilled in the art can sufficiently understand. The embodiments of the present inventive concept may be carried out independently from each other, or may be carried out together in co-dependent relationship.

Hereinafter, an embodiment of a solar cell 1 according to the present inventive concept will be described in detail with reference to the accompanying drawings. A unit cell 10 according to the present inventive concept is included in the solar cell 1 according to the present inventive concept, and thus, will be described along with describing an embodiment of the solar cell 1 according to the present inventive concept. Hatchings and dots illustrated in FIGS. 1 to 10E do not illustrate a cross-sectional surface and are illustrated for distinguishing elements.

Figure 1:
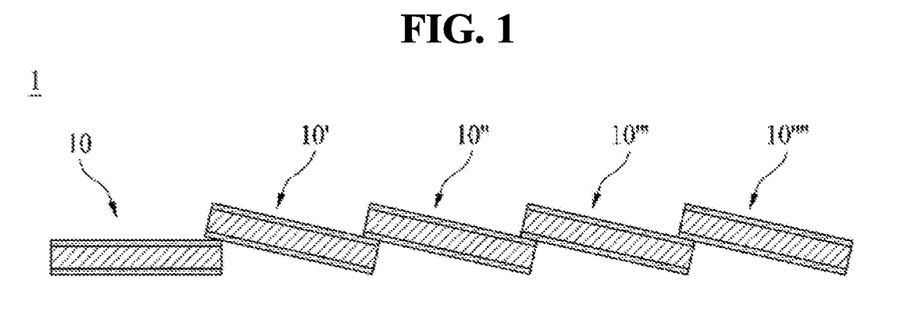
FIG. 1 is a schematic front view of a solar cell according to the present inventive concept.

Referring to FIG. 1, the solar cell 1 according to the present inventive concept converts light energy of sunlight into electrical energy. The solar cell 1 according to the present inventive concept may be implemented as a wafer type solar cell and a thin film type solar cell. Hereinafter, an embodiment where the solar cell 1 according to the present inventive concept is implemented as a wafer type solar cell will be described, but based thereon, it is obvious to those skilled in the art that the solar cell 1 according to the present inventive concept is implemented as a thin film type solar cell.

Referring to FIG. 1, the solar cell 1 according to the present inventive concept may be manufactured as a module type where a plurality of unit cells 10 are bonded to one another. Each of the unit cells 10 is manufactured by using one of a plurality of pieces which are formed by dividing a base substrate 100 (illustrated in FIG. 10D). In the solar cell 1 according to the present inventive concept, the base substrate 100 may be in a state before being divided into the unit cells 10. The base substrate 100 includes a substrate 110 (illustrated in FIG. 10A), a first base electrode 130 (illustrated in FIG. 10B) formed on one surface 110a of the substrate 110, and a second base electrode 140 (illustrated in FIG. 10D) formed on the other surface 110b of the substrate 110. In FIG. 1, the solar cell 1 according to the present inventive concept is illustrated as including five unit cells 10, 10', 10", 10'", and 10"", but this is an example and the solar cell 1 according to the present inventive concept may include two to four unit cells 10 or six or more unit cells 10. Each of the unit cells 10 may be implemented to be approximately equal, except for a disposed position thereof.

Figure 2:
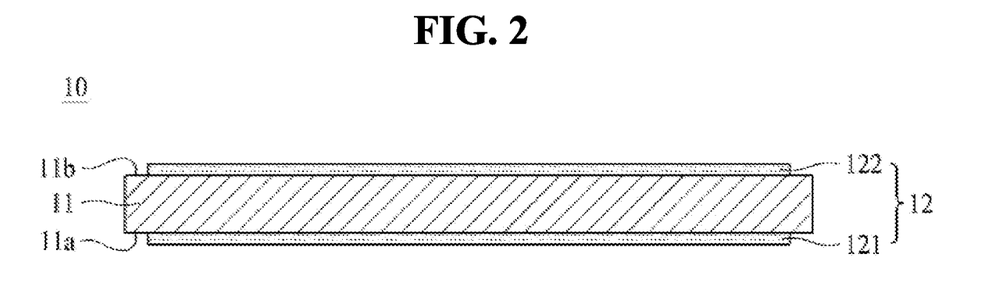
FIG. 2 is a schematic front view of a unit cell according to the present inventive concept.

Referring to FIGS. 1 and 2, each of the unit cells 10 may include a unit substrate 11 and a cell electrode 12.

Figure 10A:
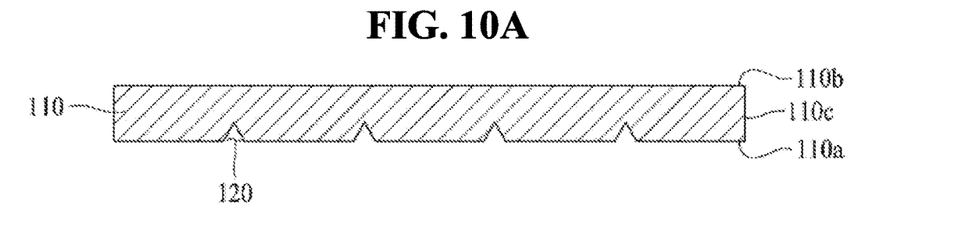
FIG. 10A is a schematic process front view illustrating a substrate preparing process of a method of manufacturing a solar cell according to the present inventive concept.
Figure 10B:
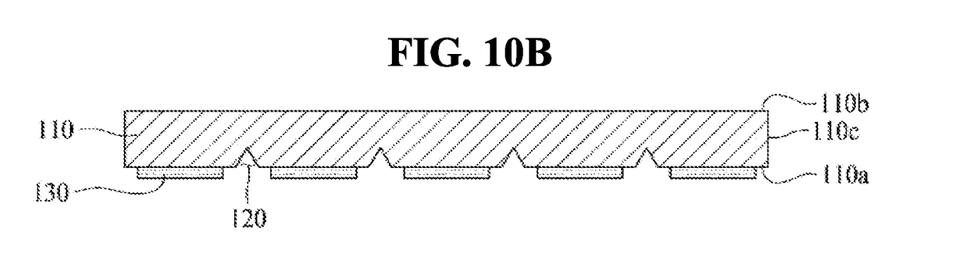
FIG. 10B is a schematic process front view illustrating a first electrode forming process of a method of manufacturing a solar cell according to the present inventive concept.
Figure 10C:
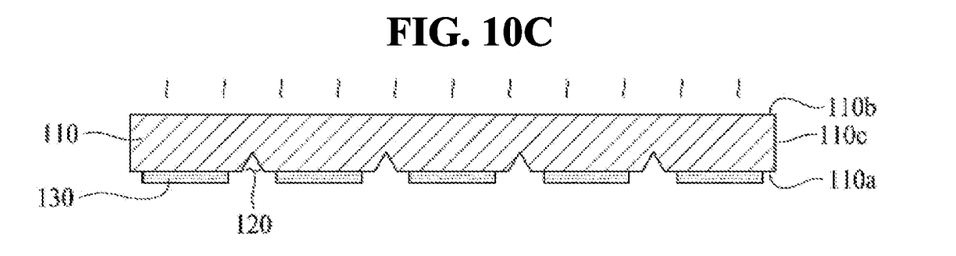
FIG. 10C is a schematic process front view illustrating a first curing process of a method of manufacturing a solar cell according to the present inventive concept.
Figure 10D:
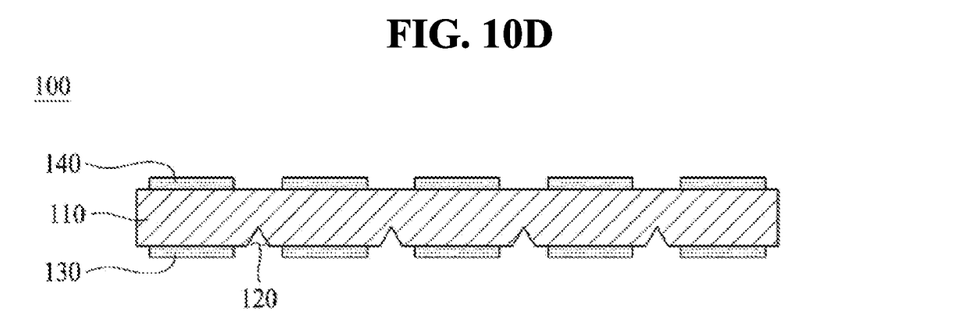
FIG. 10D is a schematic process front view illustrating a second electrode forming process of a method of manufacturing a solar cell according to the present inventive concept.

The unit substrate 11 may be formed by dividing the base substrate 100 (illustrated in FIG. 10D). The unit substrate 11 may have a certain conductive polarity.

The unit substrate 11 may be formed to be equal to the number of pieces which are formed by dividing one base substrate 100. For example, when the base substrate 100 is divided into five pieces, the unit substrate 11 may be formed as five. The unit substrate 11 may be a portion of the substrate 110 (illustrated in FIG. 10A).

The cell electrode 12 is formed on the unit substrate 11. The cell electrode 12 may have conductivity. The cell electrode 12 may be formed of a metal material, having good conductivity, such as Ag, Al, Ag+Al, Ag+Mg, Ag+Mn, Ag+Sb, Ag+Zn, Ag+Mo, Ag+Ni, Ag+Cu, or Ag+Al+Zn.

The cell electrode 12 may include a lower cell electrode 121 and an upper cell electrode 122.

The lower cell electrode 121 is formed on one surface 11a of the unit substrate 11. The one surface 11a of the unit substrate 11 may be a surface of the unit substrate 11 facing a downward direction in which a height of the solar cell 1 according to the present inventive concept is approximately lowered. The one surface 11a of the unit substrate 11 may be a surface of the unit substrate 11 facing an upward direction which is a direction opposite to the downward direction. The lower cell electrode 121 may be one electrode of the first base electrode 130 (illustrated in FIG. 10B).

The upper cell electrode 122 is formed on the other surface 11b of the unit substrate 11. When the one surface 11a of the unit substrate 11 is the surface of the unit substrate 11 facing the downward direction, the other surface 11b of the unit substrate 11 may be a surface of the unit substrate 11 facing the upward direction. Hereinafter, an example where "one surface" and "the other surface" are surfaces of specific elements facing the downward direction and the upward direction will be described. Also, the terms "upper" and "lower" described in the present specification are for distinguishing elements, and it is obvious to those skilled in the art that the terms "upper" and "lower" do not denote a specific direction. The upper cell electrode 122 may be one electrode of the second base electrode 140 (illustrated in FIG. 10D).

At least one of the upper cell electrode 122 and the lower cell electrode 121 may be formed in an uncured state PC. Therefore, the solar cell 1 according to the present inventive concept may implement a bonding force for bonding the unit cells 10 through an electrode having the uncured state PC. The uncured state PC is a state where an electrode has a bonding force. The electrodes 121 and 122 may have mobility in the uncured state PC. When one of the upper cell electrode 122 and the lower cell electrode 121 is in a cured state HC, the other electrode may be formed in the uncured state PC. Even in this case, the solar cell 1 according to the present inventive concept may implement a bonding force for bonding the unit cells 10 through an electrode having the uncured state PC. The cured state HC is a state where an electrode does not have a bonding force. The electrodes 121 and 122 may have a certain external appearance without having mobility in the cured state HC.

Referring to FIGS. 3 to 9, a solar cell 1 according to the present inventive concept may include a first unit cell 2 and a second unit cell 3.

Figure 3:
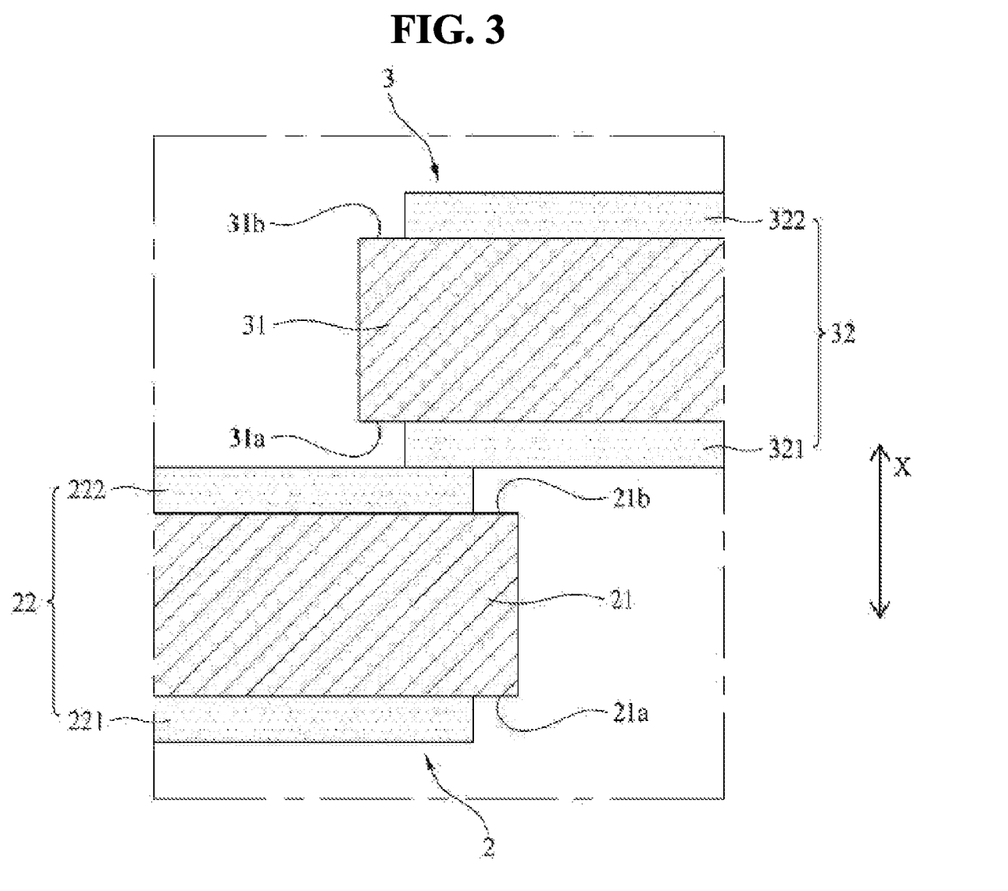
FIG. 3 is a schematic front view illustrating a shape where a first unit cell is bonded to a second unit cell, in a solar cell according to the present inventive concept.

The first unit cell 2 may be one of the unit cells 10. The first unit cell 2 is manufactured by using one of a plurality of pieces which are formed by dividing the base substrate 100. Power generated by the solar cell 1 according to the present inventive concept may move to the second unit cell 3 through the first unit cell 2.

Referring to FIG. 3, the first unit cell 2 may include a first unit substrate 21 and a first cell electrode 22.

The first unit substrate 21 may be a portion of the substrate 110 (illustrated in FIG. 10A). The first unit substrate 21 may be formed by dividing the base substrate 100. The first unit substrate 21 may have a certain conductive polarity.

The first cell electrode 22 is formed on the first unit substrate 21. The first cell electrode 22 may be formed on each of one surface 21a and the other surface 21b of the first unit substrate 21. The first cell electrode 22 may have conductivity. The first cell electrode 22 may be formed of a material such as Ag, Al, Ag+Al, Ag+Mg, Ag+Mn, Ag+Sb, Ag+Zn, Ag+Mo, Ag+Ni, Ag+Cu, or Ag+Al+Zn.

The first cell electrode 22 may include a first lower cell electrode 221 and a first upper cell electrode 222.

The first lower cell electrode 221 is formed on one surface 21a of the first unit substrate 21. The first lower cell electrode 221 may be formed on the one surface 21a of the first unit substrate 21 disposed in the downward direction. The first lower cell electrode 221 may be one electrode of the first base electrode 130 (illustrated in FIG. 10B). The first lower cell electrode 221 may be formed in one state of the cured state HC and the uncured state PC.

The first upper cell electrode 222 is formed on the other surface 21b of the first unit substrate 21. The first upper cell electrode 222 may be formed on the other surface 21b of the first unit substrate 21 disposed in the upward direction. The first upper cell electrode 222 may be one electrode of the second base electrode 140 (illustrated in FIG. 10D). The first upper cell electrode 222 may be formed in a state which differs from the first lower cell electrode. For example, when the first lower cell electrode 221 is in the cured state HC, the first upper cell electrode 222 may be formed in the uncured state PC. When the first lower cell electrode 221 is in the uncured state PC, the first upper cell electrode 222 may be formed in the cured state HC.

The second unit cell 3 may be one unit cell coupled to the first unit cell 2 among the unit cells 10. The second unit cell 3 may be coupled to the first unit cell 2 in the upward direction of the first unit cell 2. The second unit cell 3 is manufactured by using one of a plurality of pieces which are formed by dividing the base substrate 100.

The second unit cell 3 may include a second unit substrate 31 and a second cell electrode 32.

The second unit substrate 31 may be a portion of the substrate 110 (illustrated in FIG. 10A). The second unit substrate 31 may be formed by dividing the base substrate 100 (illustrated in FIG. 1C). The second unit substrate 31 may have a certain conductive polarity.

The second cell electrode 32 is formed on the second unit substrate 31. The second cell electrode 32 may be formed on each of one surface 31a and the other surface 31b of the second unit substrate 31. The second cell electrode 32 may have conductivity. The second cell electrode 32 may be formed of a material such as Ag, Al, Ag+Al, Ag+Mg, Ag+Mn, Ag+Sb, Ag+Zn, Ag+Mo, Ag+Ni, Ag+Cu, or Ag+Al+Zn.

The second cell electrode 32 and the first cell electrode 22 may be bonded to each other without a bonding material, and thus, may couple the second unit cell 3 to the first unit cell 2. That is, as the second cell electrode 32 and the first cell electrode 22 are bonded to each other, the second unit cell 3 may be coupled to the first unit cell 2. Accordingly, the solar cell 1 according to the present inventive concept may realize the following effects.

First, the solar cell 1 according to the present inventive concept is implemented so that the unit cells 2 and 3 are bonded to each other through the cell electrodes 22 and 32. Therefore, comparing with the related art where the unit cells 10 are bonded to each other by using a bonding material, in the solar cell 1 according to the present inventive concept, a series of process of distributing a bonding material may be omitted in a process of manufacturing a solar cell. Accordingly, in the solar cell 1 according to the present inventive concept, a time taken in manufacturing a solar cell may be reduced, and thus, the productivity of solar cells may increase.

Second, the solar cell 1 according to the present inventive concept is implemented so that the unit cells 2 and 3 are bonded to each other without a bonding material, and thus, a generated power needs not move to the bonding material. Accordingly, the solar cell 1 according to the present inventive concept may fundamentally prevent the power generating efficiency of the solar cell from being reduced by the resistance of the bonding material, thereby enhancing the quality of a finished solar cell.

The second cell electrode 32 and the first cell electrode 22 may be formed of the same material, and thus, may be bonded to each other. For example, the second cell electrode 32 and the first cell electrode 22 may all be formed of an Ag material. Therefore, the solar cell 1 according to the present inventive concept is implemented to decrease an internal resistance thereof. This is because a resistance is more reduced in a case, where power moves to the same material, than a case where power moves to different materials, in a process where power moves to the first cell electrode 22 and the second cell electrode 32. Accordingly, the solar cell 1 according to the present inventive concept may more increase the power generating efficiency of a solar cell.

The second cell electrode 32 may include a second lower cell electrode 321 and a second upper cell electrode 322.

The second lower cell electrode 321 is formed on one surface 31a of the second unit substrate 31. The second lower cell electrode 321 may be formed on the one surface 31a of the second unit substrate 31 disposed in the downward direction. The second lower cell electrode 321 may be one electrode of the first base electrode 130. The second lower cell electrode 321 may be formed in one state of the cured state HC and the uncured state PC.

The second upper cell electrode 322 is formed on the other surface 31b of the second unit substrate 31. The second upper cell electrode 322 may be formed on the other surface 31b of the second unit substrate 31 in the upward direction. The second upper cell electrode 322 may be one electrode of the second base electrode 140. When the second lower cell electrode 321 is in the cured state HC, the second upper cell electrode 322 may be formed in the uncured state PC. When the second lower cell electrode 321 is in the uncured state PC, the second upper cell electrode 322 may be formed in the cured state HC.

The solar cell 1 according to the present inventive concept, as illustrated in FIG. 3, is implemented so that the second lower cell electrode 321 and the first upper cell electrode 222 are bonded to each other, and thus, the second unit cell 3 is coupled to the first unit cell 2. Hereinafter, an example where the second lower cell electrode 321 and the first upper cell electrode 222 are bonded to each other and thus the second unit cell 3 is coupled to the first unit cell 2 will be described, but this is an example and the second unit cell 3 may be coupled to the first unit cell 2 as the second upper cell electrode 322 and the first lower cell electrode 221 are bonded to each other.

At least one of the second lower cell electrode 321 and the first upper cell electrode 222 may be formed in the uncured state PC. Therefore, the solar cell 1 according to the present inventive concept may implement a bonding force for coupling the unit cells 2 and 3. For example, all of the second lower cell electrode 321 and the first upper cell electrode 222 may be formed in the uncured state PC, and thus, the second unit cell 3 may be coupled to the first unit cell 2. When at least one of the second lower cell electrode 321 and the first upper cell electrode 222 is formed in the uncured state PC, the other electrode may be formed in the cured state HC, and thus, the second unit cell 3 may be coupled to the first unit cell 2.

Figure 4:
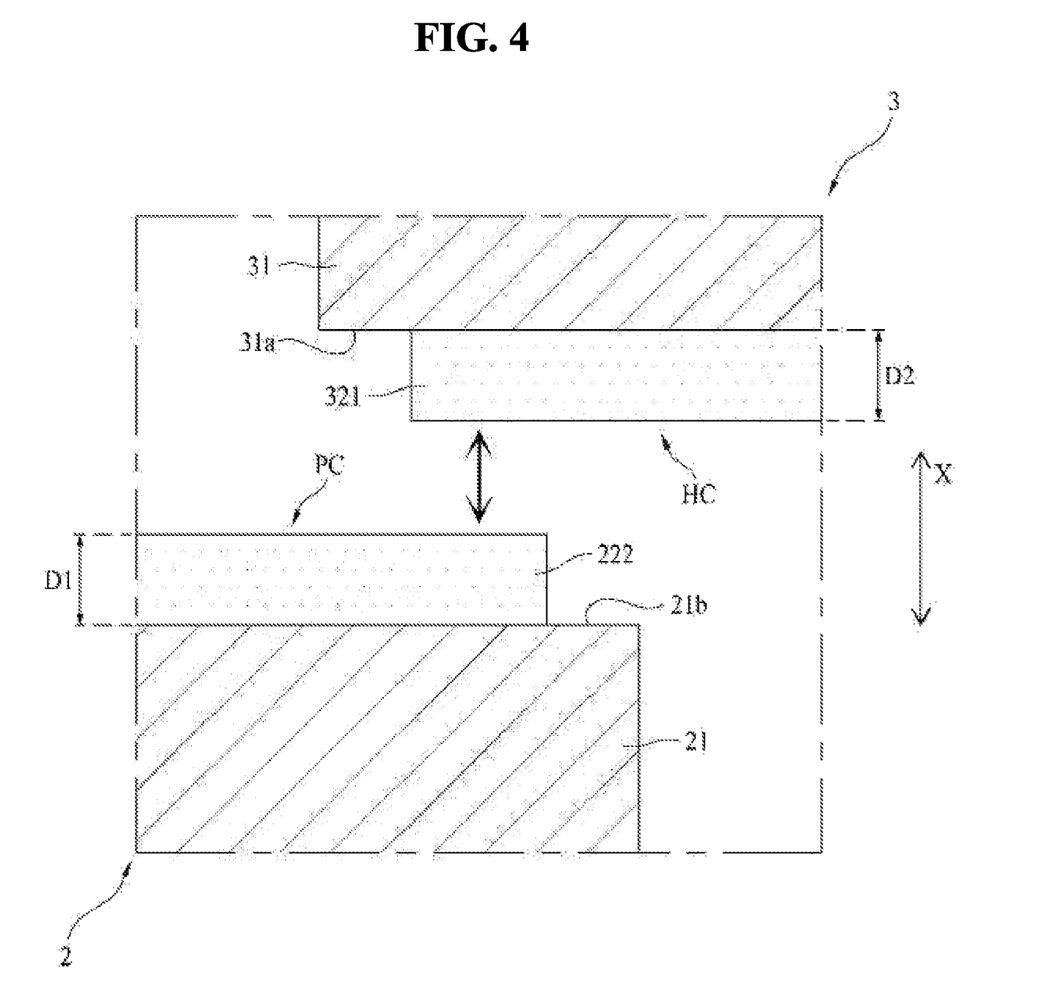
FIG. 4 is a schematic front view illustrating a shape before a first unit cell is bonded to a second unit cell, in an example of a solar cell according to the present inventive concept.
Figure 5:
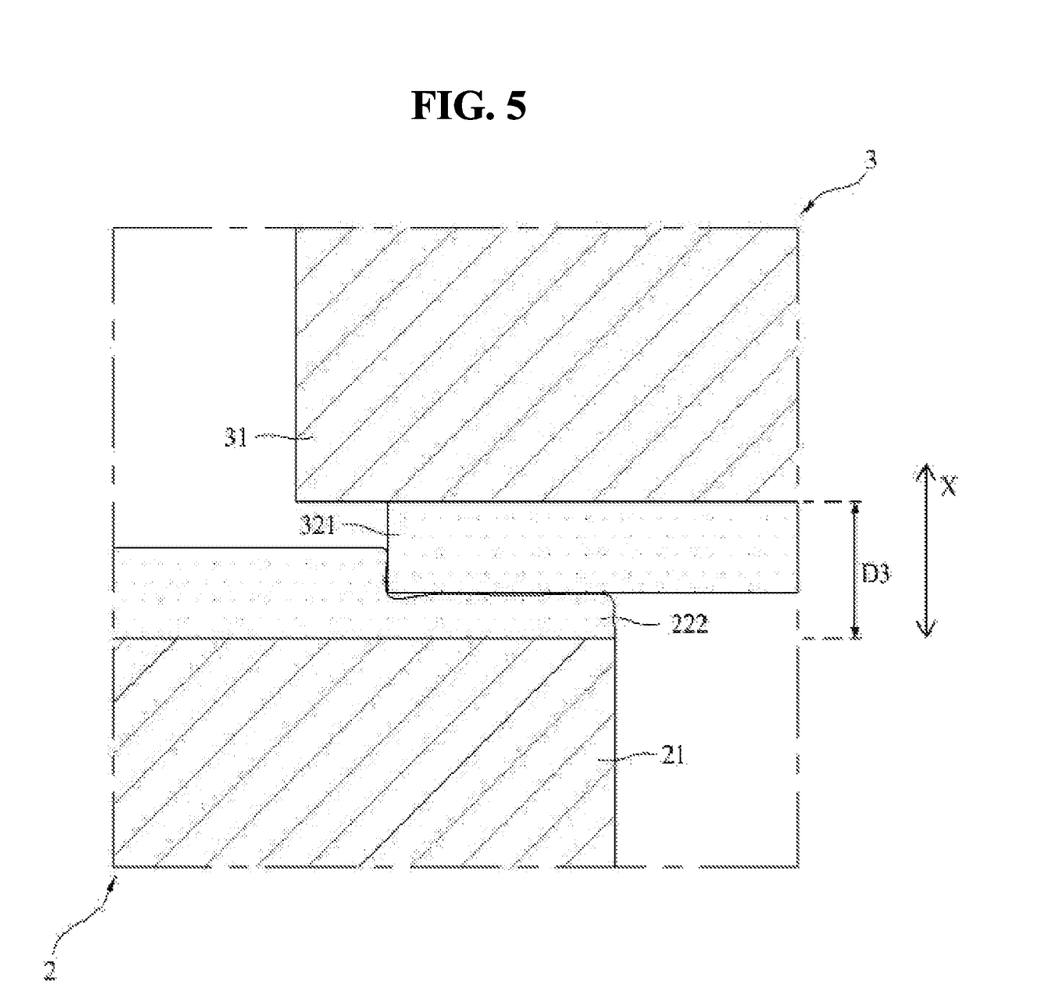
FIG. 5 is a schematic front view illustrating a shape after a first unit cell is bonded to a second unit cell, in an example of a solar cell according to the present inventive concept.

Referring to FIGS. 4 and 5, the first upper cell electrode 222 may be formed in the uncured state PC, and thus, the second lower cell electrode 321 may be bonded thereto, whereby a thickness thereof may be reduced. Therefore, in the solar cell 1 according to the present inventive concept, a total thickness thereof may be reduced, and thus, a distance by which a generated power moves may be reduced. Accordingly, the solar cell 1 according to the present inventive concept may be implemented to decrease a total resistance thereof. The thickness may be a length with respect to a first axial direction (an X-axis direction) which corresponds to a direction parallel to each of the upward direction and the downward direction and corresponds to the same direction as a direction in which the second unit cell 3 is apart from the first unit cell 2. Although not shown, the second lower cell electrode 321 may also be formed in the uncured state PC, and thus, the first upper cell electrode 222 may be bonded thereto, whereby a thickness thereof may be reduced. The second lower cell electrode 321 and the first upper cell electrode 222 may be bonded to each other, and thus, may be formed to have the same thickness.

For example, as illustrated in FIGS. 4 and 5, when the first upper cell electrode 222 is formed to have a first thickness D1 and the second lower cell electrode 321 is formed to have a second thickness D2, a third thickness D3 which is formed as the second lower cell electrode 321 and the first upper cell electrode 222 are bonded to each other may have a value which is less than a sum of the first thickness D1 and the second thickness D2. This is because at least one of the first upper cell electrode 222 and the second lower cell electrode 321 is formed in the uncured state PC. Accordingly, the solar cell 1 according to the present inventive concept may be implemented to decrease a total thickness thereof. The third thickness D3 may be a separation distance between the second unit cell 3 and the first unit cell 2 with respect to the first axial direction (the X-axis direction). In FIG. 4, it is illustrated that the first upper cell electrode 222 is formed in the uncured state PC, but this is an example and the third thickness D3 may decrease as the second lower cell electrode 321 is formed in the uncured state PC.

When at least one of the second lower cell electrode 321 and the first upper cell electrode 222 is formed in the uncured state PC, as illustrated in FIG. 5, the second lower cell electrode 321 and the first upper cell electrode 222 may be disposed to partially overlap each other with respect to the first axial direction (the X-axis direction). Accordingly, a total thickness of the solar cell 1 according to the present inventive concept may be reduced.

Hereinafter, an embodiment of a pattern of each of the first upper cell electrode 222 and the second lower cell electrode 321 will be described with reference to the accompanying drawings. When the second unit cell 3 is coupled to the first unit cell 2 as the second upper cell electrode 322 and the first lower cell electrode 221 are bonded to each other, the first lower cell electrode 221 may be implemented to be approximately equal to the below-described second lower cell electrode 321, and the second upper cell electrode 322 may be implemented to be approximately equal to the first upper cell electrode 222.

Figure 6:
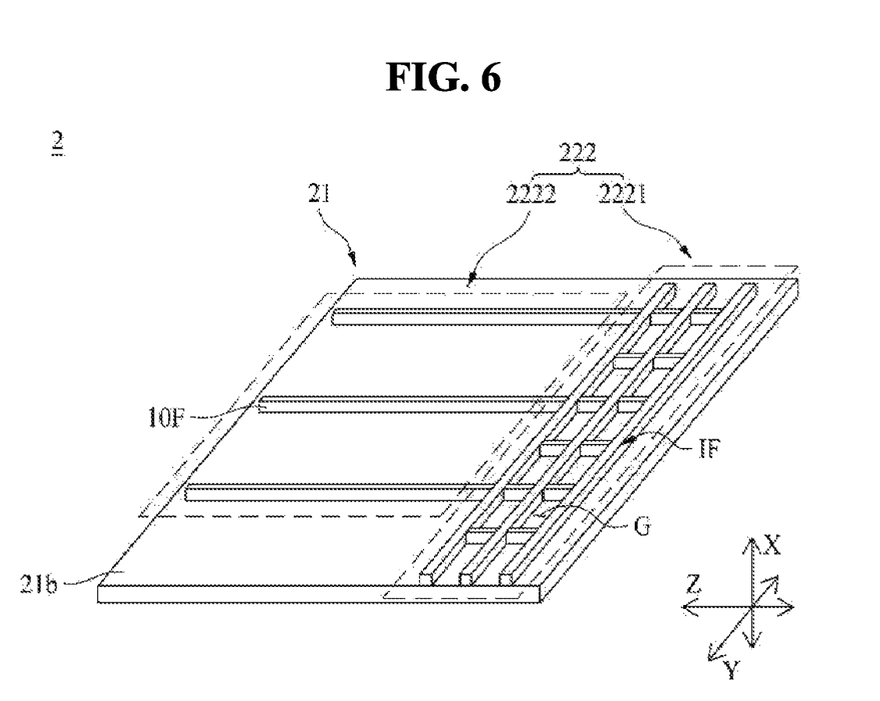
FIG. 6 is a schematic perspective view illustrating a first junction electrode and a first non-junction electrode formed in a first upper cell electrode, in a solar cell according to the present inventive concept.

Referring to FIG. 6, the first upper cell electrode 222 may include a first junction electrode 2221.

The second lower cell electrode 321 is bonded to the first junction electrode 2221. The first junction electrode 2221 may be one electrode of the first upper cell electrode 222 bonded to the second lower cell electrode 321. The first junction electrode 2221 may be coupled to the first unit substrate 21. The first junction electrode 2221 may be formed in the cured state HC.

The first junction electrode 2221 may include a first junction surface 1A and an inserting groove G.

The first junction surface 1A (illustrated in FIG. 8) may be one surface of the first junction electrode 2221 facing the second lower cell electrode 321. In this case, the other surface of the first junction electrode 2221 may face the first unit substrate 21. The second lower cell electrode 321 may be bonded to the first junction surface 1A.

The inserting groove G is formed in the first junction surface 1A. The inserting groove G may be formed by a process of processing a certain deep groove from the first junction surface 1A. The inserting groove G may be formed to have the same size as that of the first upper cell electrode 222 with respect to the first axial direction (the X-axis direction). In FIG. 6, it is illustrated that fourteen inserting grooves G are formed in the first junction surface 1A, but this is an example and one to thirteen inserting grooves G or fifteen or more inserting grooves G may be formed in the first junction surface 1A.

Referring to FIG. 6, the first junction electrode 2221 may include a first junction finger bar 1F.

The first junction finger bar 1F may perform a function of moving power, generated from the first unit substrate 21, to the second lower cell electrode 321. The first junction finger bar 1F is formed with the inserting groove G being disposed inward therefrom. The first junction finger bar 1F may include a first junction finger member formed in a second axial direction (a Y-axis direction) and a second junction finger member formed in a third axial direction (a Z-axis direction) vertical to the second axial direction (the Y-axis direction). The second junction finger member and the first junction finger member may be coupled to each other. The second junction finger member and the first junction finger member may be disposed to surround the inserting groove G. For example, two second junction finger members and two first junction finger members may be disposed outside the inserting groove G. One second junction finger member and two first junction finger members may also be disposed outside the inserting groove G. FIG. 6 illustrates three first junction finger members and twelve second junction finger members. The second axial direction (the Y-axis direction) may be a direction vertical to the first axial direction (the X-axis direction). The third axial direction (the Z-axis direction) may be a direction vertical to each of the second axial direction (the Y-axis direction) and the first axial direction (the X-axis direction).

Referring to FIG. 6, the first upper cell electrode 222 may include a first non-junction electrode 2222.

The first non-junction electrode 2222 is coupled to the first junction electrode 2221. The first non-junction electrode 2222 may be coupled to the first junction electrode 2221 and may perform a function of moving the power, generated from the first unit substrate 21, to the first junction electrode 2221. The first non-junction electrode 2222 may be one electrode of the first upper cell electrode 222 which is not bonded to the second lower cell electrode 321. The first non-junction electrode 2222 may be coupled to the first unit substrate 21. The first non-junction electrode 2222 may be formed in the cured state HC which is the same state as that of the first junction electrode 2221.

The first non-junction electrode 2222 may include a plurality of first non-junction finger bars 10F which are disposed apart from one another. The first non-junction finger bars 10F may be disposed apart from one another with respect to the second axial direction (the Y-axis direction). The first non-junction finger bars 10F may be formed to extend in the third axial direction (the Z-axis direction). The first non-junction finger bars 10F may be formed to have a linear shape in the third axial direction (the Z-axis direction). The first non-junction finger bars 10F may be coupled to the first junction electrode 2221. The first non-junction finger bars 10F may perform a function of moving the generated power to the first junction electrode 2221. FIG. 6 illustrates three first non-junction finger bars 10F.

Figure 7:
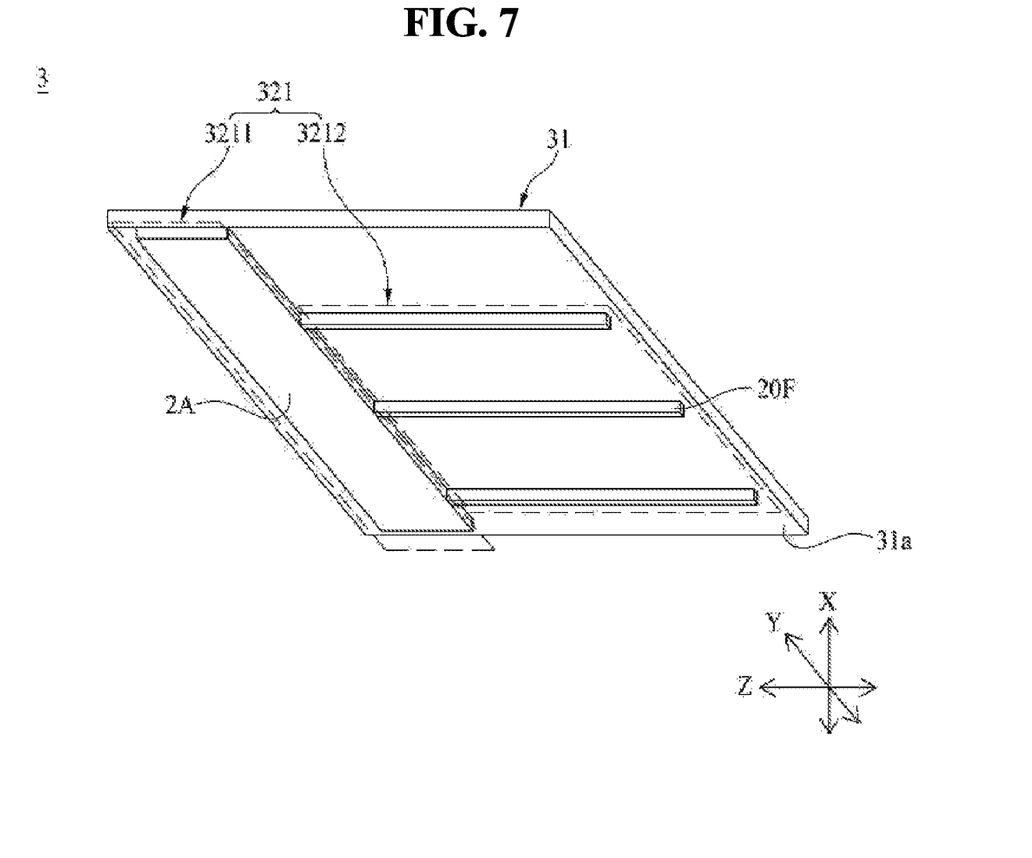
FIG. 7 is a schematic perspective view illustrating a second junction electrode and a second non-junction electrode formed in a second lower cell electrode, in a solar cell according to the present inventive concept.
Figure 8:
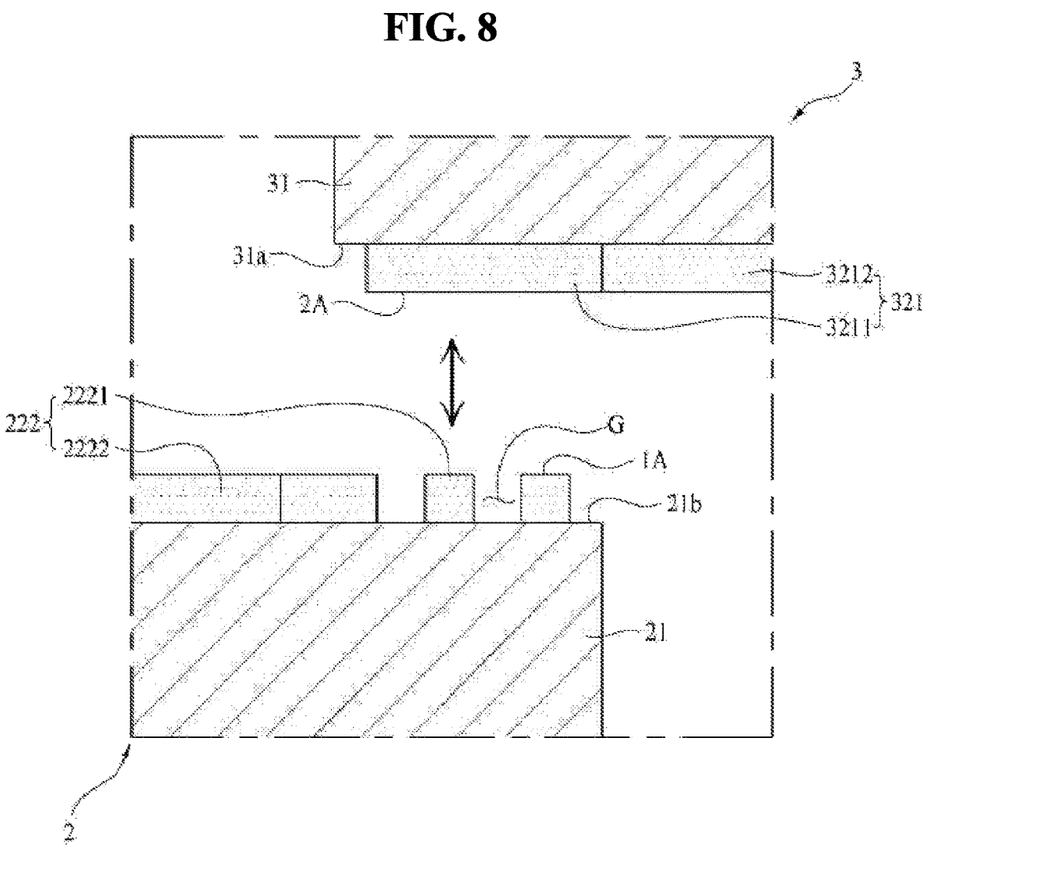
FIG. 8 is a schematic front view illustrating a shape before a second junction electrode is bonded to a first junction electrode, in a solar cell according to the present inventive concept.
Figure 9:
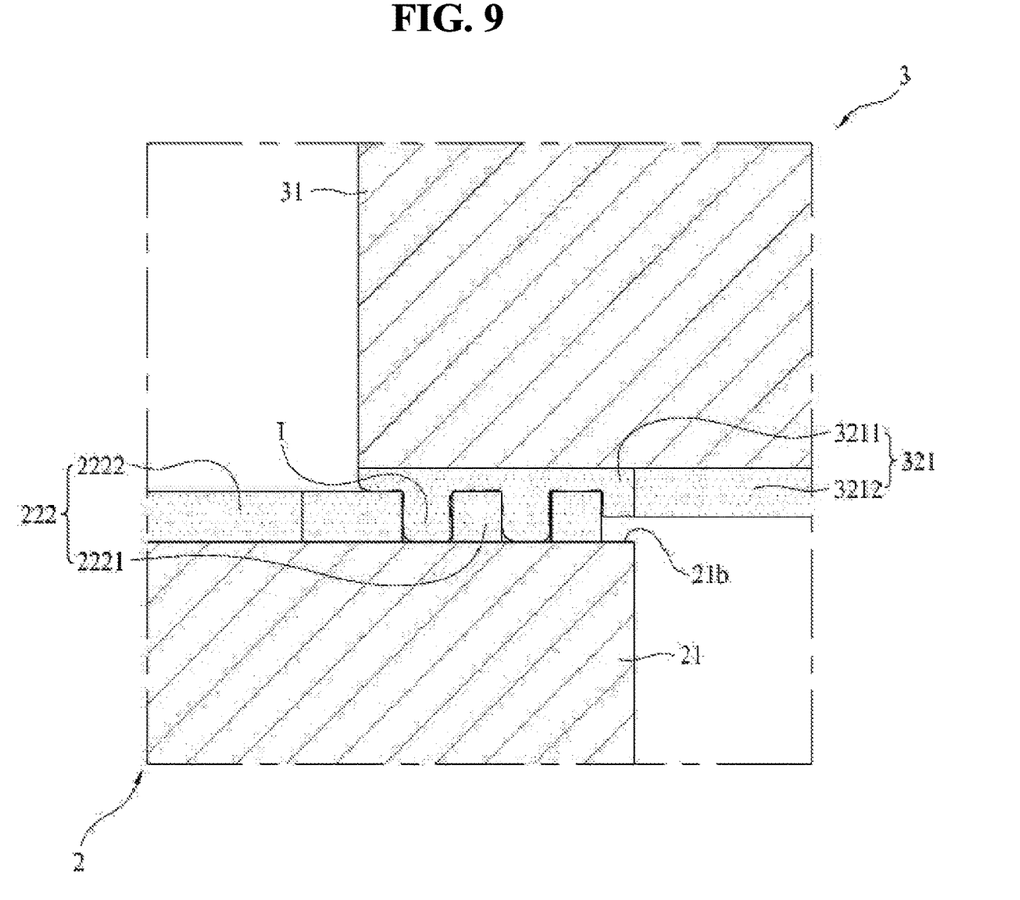
FIG. 9 is a schematic front view illustrating a shape where an inserting member is inserted into an inserting groove as a second junction electrode is bonded to a first junction electrode, in a solar cell according to the present inventive concept.

Referring to FIGS. 7 to 9, the second lower cell electrode 321 may include a second junction electrode 3211.

The second junction electrode 3211 is bonded to the first junction electrode 2221. The second junction electrode 3211 may be one electrode of the second lower cell electrode 321 bonded to the first junction electrode 2221. The second junction electrode 3211 may be coupled to the second unit substrate 31. The second junction electrode 3211 may be formed in the cured state HC.

Referring to FIGS. 7 and 8, the second junction electrode 3211 may include a second junction surface 2A.

The second junction surface 2A may be one surface of the second junction electrode 3211 facing the first upper cell electrode 222. The other surface of the second junction electrode 3211 may face the second unit substrate 31. The second junction surface 2A may be bonded to the first junction electrode 2221. The second junction surface 2A may be formed to have a flat shape before the second junction electrode 3211 and the first junction electrode 2221 are bonded to each other. That is, the second junction surface 2A may be formed in a flat shape having no curve before the second junction electrode 3211 and the first junction electrode 2221 are bonded to each other.

Referring to FIG. 9, the second junction electrode 3211 may include an inserting member I.

The inserting member I is inserted into the inserting groove G as the second junction electrode 3211 is bonded to the first junction electrode 2221. Therefore, the solar cell 1 according to the present inventive concept may be implemented so that the second junction electrode 3211 is supported by the first junction electrode 2221. Accordingly, the solar cell 1 according to the present inventive concept may enhance a bonding force between the second junction electrode 3211 and the first junction electrode 2221, thereby increasing a coupling force between the first unit cell 2 and the second unit cell 3. The inserting member I may be formed in the uncured state PC and may be inserted into the inserting member I. The inserting member I may be formed in a shape corresponding to the inserting groove G. The second junction electrode 3211 may include a plurality of inserting members I equal to the number of inserting grooves G.

Hereinabove, it has been described that the first junction electrode 2221 includes the inserting groove G and the second junction electrode 3211 includes the inserting member I, but it should be understood that this is an example and it is obvious to those skilled in the art that the first junction electrode 2221 includes the inserting member I and the second junction electrode 3211 includes the inserting groove G.

Referring to FIGS. 7 to 9, the second lower cell electrode 321 may include a second non-junction electrode 3212.

The second non-junction electrode 3212 is coupled to the second junction electrode 3211. The second non-junction electrode 3212 may be coupled to the second junction electrode 3211 and may perform a function of moving power generated from the second unit substrate 31. The second non-junction electrode 3212 may be one electrode of the second lower cell electrode 321 which is not bonded to the first upper cell electrode 222. The second non-junction electrode 3212 may be coupled to the second unit substrate 31. The second non-junction electrode 3212 may be formed in the uncured state PC which is the same state as that of the second junction electrode 3211.

The second non-junction electrode 3212 may include a plurality of second non-junction finger bars 20F which are disposed apart from one another. The second non-junction finger bars 20F may be disposed apart from one another with respect to the second axial direction (the Y-axis direction). The second non-junction finger bars 20F may be formed to extend in the third axial direction (the Z-axis direction). The second non-junction finger bars 20F may be coupled to the second junction electrode 3211. The second non-junction finger bars 20F may perform a function of moving the power generated from the second unit substrate 31. FIG. 7 illustrates three second non-junction finger bars 20F.

Hereinafter, an embodiment of a method of manufacturing a solar cell according to the present inventive concept will be described in detail with reference to the accompanying drawings. The method of manufacturing a solar cell according to the present inventive concept is for manufacturing the solar cell 1 according to the present inventive concept.

Referring to FIG. 10A, a method of manufacturing a solar cell according to the present inventive concept may include a substrate preparing process.

The substrate preparing process is a process of preparing the substrate 10 where a plurality of division parts 120 for dividing the substrate 110 into a plurality of pieces are formed. The substrate preparing process may be performed by a substrate loading apparatus (not shown) which loads the substrate 110 into a processing space (not shown) for manufacturing a solar cell. The processing space may accommodate a plurality of manufacturing apparatuses needed for manufacturing a solar cell and may be wholly implemented as a chamber.

The substrate 110 may have a certain conductive polarity. For example, the substrate 110 may be formed of an N-type silicon wafer or a P-type silicon wafer. Although not shown, the one surface 110a of the substrate 110 may be formed in a concave-convex structure. The substrate 110 may include a bottom surface disposed in the downward direction, a top surface disposed in the upward direction, and a side surface 110c connected to each of the bottom surface and the top surface of the substrate 110. In this case, the one surface 110a of the substrate 110 may correspond to one of the bottom surface of the substrate 110, the top surface of the substrate 110, and the side surface 110c of the substrate 110. For example, when the one surface 110a of the substrate 110 corresponds to the bottom surface of the substrate 110, the other surface 110b of the substrate 110 corresponds to the top surface of the substrate 110. In this case, each of a plurality of thin film layers formed on the one surface 110a of the substrate 110 and the other surface 110b of the substrate 110 may be formed in a concave-convex structure.

The division parts 120 are for dividing the substrate 110 into the plurality of pieces. The division parts 120 may be formed on the one surface 110a of the substrate 110. The division parts 120 may be formed through a scribing process of processing a certain deep groove from the one surface 110a of the substrate 110. The scribing process may be performed by a scribing apparatus (not shown) which irradiates a laser onto the substrate 110 to remove a certain region of the substrate 110. In FIG. 10A, it is illustrated that the scribing process is performed on the one surface 110a of the substrate 110, but this is an example and the scribing process may be performed on the other surface 110b of the substrate 110. Also, in the present specification, an example where the division parts 120 are formed through the scribing process has been described, but this is an example and the division parts 120 may be formed by a process of digesting the substrate 110 into an etching bath (not shown), a dry etching process, or a process using a mask. In a case for dividing the substrate 110 into five pieces, as illustrated in FIG. 10A, four division parts 120 may be formed on the one surface 110a of the substrate 110.

Although not shown, one or more thin film layers may be formed on the substrate 110. Hereinafter, an example of a thin film layer formed on the substrate 110 will be described.

First, a first thin film layer may be formed on the substrate 110. A process of forming the first thin film layer may be performed after the scribing process. The first thin film layer may be a semiconductor layer which is formed as a thin film type on the substrate 110. The first thin film layer may form a PN junction along with the substrate 110. Therefore, in a case where the substrate 110 is formed of an N-type silicon wafer, the first thin film layer may be a P-type semiconductor layer. The first thin film layer may be formed by using a chemical vapor deposition (CVD) process and/or the like. The first thin film layer may be formed in a PIN structure where a P-type semiconductor material, an I-type semiconductor material, and an N-type semiconductor material are sequentially stacked. As described above, when the first thin film layer is formed in the PIN structure, the I-type semiconductor material is depleted by the P-type semiconductor material and the N-type semiconductor material, and thus, an electric field is generated therein and a hole and an electron generated from sunlight are drifted by the electric field and are collected into the P-type semiconductor material and the N-type semiconductor material. In a case where the first thin film layer is formed in the PIN structure, it is preferable that the P-type semiconductor material is formed on the first thin film layer, and then, the I-type semiconductor material and the N-type semiconductor material are formed. The reason is for that the P-type semiconductor material is formed close to a light receiving surface so as to collection efficiency based on incident light because the drift mobility of a hole is lower than the drift mobility of an electron generally. The method of manufacturing a solar cell according to the present inventive concept may form the first thin film layer to have a stacked structure. For example, the method of manufacturing a solar cell according to the present inventive concept may form the first thin film layer to have a stacked structure having a tandem(PIN/PIN) type or a triple(PIN/PIN/PIN) type. The first thin film layer may be formed on at least one of the one surface 110a, the other surface 110b, and the side surface of the substrate 110, or may be formed on each of the one surface 110a, the other surface 110b, and the side surface of the substrate 110.

Subsequently, a second thin film layer is formed on the first thin film layer. A process of forming the second thin film layer may be performed after a process of forming the first thin film layer. The second thin film layer may be a transparent conductive layer. For example, the second thin film layer may be a transparent conductive oxide (TCO) layer. The first thin film layer may protect the first thin film layer, collect a carrier (for example, a hole (+)) generated in the substrate 110, and move the collected carrier in the upward direction. The second thin film layer may be formed of a transparent conductive material such as indium tin oxide (ITO), ZnOH, ZnO:B, ZnO:Al, SnO$_2$, or SnO$_2$:F. The second thin film layer may be formed of a transparent conductive material such as ZnO, ZnO:B, ZnO:Al, or Ag by using a sputtering process or a metal organic CVD (MOCVD) process. The second thin film layer has a function which scatters sunlight to allow the sunlight to travel at various angles, and thus, increases a ratio of light re-incident on the first thin film layer.

Subsequently, a third thin film layer is formed on the second thin film layer. A process of forming the third thin film layer may be performed after a process of forming the second thin film layer. In a case which forms the third thin film layer on the second thin film layer, the first thin film layer may be implemented as an intrinsic semiconductor layer, the second thin film layer may be implemented as a semiconductor layer, and the third thin film layer may be implemented as a transparent conductive layer. In this case, the plurality of thin film layers may be formed by using a plasma enhanced CVD (PECVD) process and a sputtering process.

The method of manufacturing a solar cell according to the present inventive concept may selectively form the first thin film layer, the second thin film layer, and the third thin film layer. That is, the method of manufacturing a solar cell according to the present inventive concept may form one or more of the first thin film layer, the second thin film layer, and the third thin film layer, or may not form all of the first thin film layer, the second thin film layer, and the third thin film layer.

Referring to FIG. 10B, the method of manufacturing a solar cell according to the present inventive concept may include a first electrode forming process.

The first electrode forming process is a process of forming a plurality of first base electrodes 130 having conductivity on the one surface 110a of the substrate 110. The first electrode forming process may be performed after the substrate preparing process. The first base electrode 130 formed by performing the first electrode forming process may be formed of a material such as Ag, Al, Ag+Al, Ag+Mg, Ag+Mn, Ag+Sb, Ag+Zn, Ag+Mo, Ag+Ni, Ag+Cu, or Ag+Al+Zn. In FIG. 10B, it is illustrated that the first electrode forming process is performed on the one surface 110a of the substrate 110, but this is an example and the first electrode forming process may be performed on the other surface 110b of the substrate 110.

Referring to FIG. 10C, the method of manufacturing a solar cell according to the present inventive concept may include a first curing process.

The first curing process is a process of curing the first base electrode 130. The first curing process may be performed after the first electrode forming process. The first curing process may be performed by a heating apparatus (not shown) which heats the first base electrode 130. As the first curing process is performed, the first base electrode 130 may be formed in the cured state HC.

Referring to FIG. 10D, the method of manufacturing a solar cell according to the present inventive concept may include a second electrode forming process.

The second electrode forming process is a process of forming a plurality of second base electrodes 140, having conductivity and the uncured state PC, on the other surface 110b of the substrate 110. The second electrode forming process may be performed after the first electrode forming process. The second base electrode 140 formed by performing the second electrode forming process may be formed of a material such as Ag, Al, Ag+Al, Ag+Mg, Ag+Mn, Ag+Sb, Ag+Zn, Ag+Mo, Ag+Ni, Ag+Cu, or Ag+Al+Zn. In FIG. 10D, it is illustrated that the second electrode forming process is performed on the other surface 110b of the substrate 110, but this is an example and the second electrode forming process may be performed on the one surface 110a of the substrate 110.

The method of manufacturing a solar cell according to the present inventive concept is implemented not to include a process of curing the second base electrode 140 after the second electrode forming process is performed. Accordingly, the method of manufacturing a solar cell according to the present inventive concept may implement a bonding force which bonds the unit cells 10 through the second base electrode 140 having the uncured state PC.

Figure 10E:
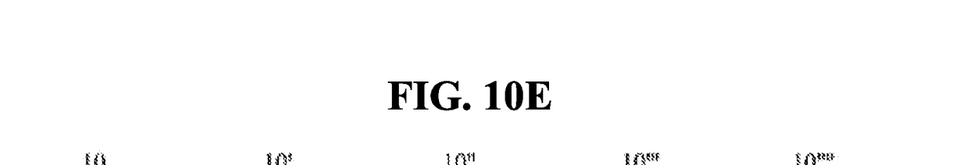
FIG. 10E is a schematic process front view illustrating a division process of a method of manufacturing a solar cell according to the present inventive concept.

Referring to FIG. 10E, the method of manufacturing a solar cell according to the present inventive concept may include a division process.

The division process is a process of dividing the substrate 110 into a plurality of pieces through the division parts 120 to form the unit cells 10. That is, the division process is a process of dividing the base substrate 100 through the division parts 120 to form a plurality of unit cells 10. The division process may be performed by a division apparatus (not shown) which applies an external force, such as a bending force, to the base substrate 100. The division process may be performed after the second electrode forming process. In a case for dividing the base substrate 100 into N (where N is an integer of 2 or more) number of unit cells 10, the division process may be performed N−1 times. For example, as illustrated in FIG. 10E, in a case for dividing the base substrate 100 into five unit cells 10, the division process may be performed four times.

Referring again to FIG. 1, the method of manufacturing a solar cell according to the present inventive concept may include a bonding process.

The bonding process is a process of bonding the unit cells 10 through the second base electrode 140 having the uncured state PC. The bonding process may be performed by a bonding apparatus (not shown) which moves and bonds the divided unit cells 10. The bonding process may be performed after the division process. In a case where the base substrate 100 has been divided into N number of unit cells 10, the bonding process may be performed N−1 times. For example, as illustrated in FIG. 10E, in a case where the base substrate 100 has been divided into five unit cells 10, the bonding process may be performed four times.

Although not shown, the method of manufacturing a solar cell according to the present inventive concept may include a second curing process.

The second curing process is a process of curing the bonded unit cells 10. The second curing process may be performed by the heating apparatus. The second curing process may be performed after the bonding process. As the second curing process is performed, the solar cell 1 according to the present inventive concept may be manufactured as a module type where the unit cells 10 are bonded to one another.

The present inventive concept described above are not limited to the above-described embodiments and the accompanying drawings and those skilled in the art will clearly appreciate that various modifications, deformations, and substitutions are possible without departing from the scope and spirit of the invention.

The invention claimed is:

1. A method of manufacturing a solar cell, the method comprising:
   a substrate preparing process of preparing a substrate where a plurality of division parts for dividing the substrate into a plurality of pieces are formed;
   a first electrode forming process of forming a plurality of first base electrodes having conductivity on a first surface of the substrate;
   a first curing process of curing the first base electrode;
   a second electrode forming process of forming a plurality of second base electrodes, having conductivity and an uncured state, on a second surface of the substrate;
   a division process of dividing the substrate into a plurality of pieces through the division parts to form a plurality of unit cells including a first unit cell and a second unit cell, each of the first unit cell and the second unit cell including a first cell electrode in a cured state and a second cell electrode in an uncured state; and
   a bonding process of bonding the first unit cell and the second unit cell through the first cell electrode of the first unit cell and the second cell electrode of the second unit cell without a bonding material, the first unit cell and the second unit cell partially overlapping each other.

2. The method of claim 1, further comprising a second curing process of curing the bonded unit cells after the bonding process is performed.

3. The method of claim 1, wherein a thickness of the second cell electrode is reduced as the second cell electrode is bonded to the first cell electrode.

4. The method of claim 1, wherein
   the first cell electrode is formed to have a first thickness,
   the second cell electrode is formed to have a second thickness, and
   a third thickness between the first unit cell and the second unit cell, formed as the second cell electrode and the first cell electrode are bonded to each other, has a value which is less than a sum of the second thickness and the first thickness.

5. The method of claim 1, wherein the second cell electrode and the first cell electrode and are disposed to partially overlap each other with respect to a first axial direction in which the second unit cell and the first unit cell are apart from each other.

6. The method of claim 1, wherein the second cell electrode and the first cell electrode are formed to have the same thickness.

7. The method of claim 1, wherein the first cell electrode and the second cell electrode are all formed of the same material and are bonded to each other.

8. The method of claim 1, wherein
   the first cell electrode comprises a first junction electrode bonded to the second cell electrode, and
   the first junction electrode comprises a first junction surface facing the second cell electrode and an inserting groove formed in the first junction surface.

9. The method of claim 8, wherein
   the first junction electrode further comprises a first junction finger bar formed with the inserting groove being disposed inward therefrom, and
   the first junction finger bar comprises a first junction finger member, formed in a direction vertical to a direction in which the first unit cell and the second unit cell are apart from each other, and a second junction finger member coupled to the first junction finger member.

10. The method of claim 8, wherein
    the first cell electrode comprises a first non-junction electrode coupled to the first junction electrode, and
    the first non-junction electrode comprises a plurality of first non-junction finger bars disposed apart from one another.

11. The method of claim 8, wherein
    the second cell electrode comprises a second junction electrode bonded to the first junction electrode,
    the second junction electrode comprises a second junction surface facing the first junction electrode, and
    the second junction surface is formed to have a flat shape before the second junction electrode and the first junction electrode are bonded to each other.

12. The method of claim 8, wherein
    the second cell electrode comprises a second junction electrode bonded to the first junction electrode, and
    the second junction electrode comprises an inserting member bonded to the first junction electrode and inserted into the inserting groove.

13. The method of claim 1, wherein the first cell electrode of the first unit cell includes an insertion groove, the second cell electrode of the second unit cell includes an insertion member, and the insertion member is inserted into the insertion groove as the first cell electrode in the cured state and the second cell electrode in the uncured state are bonded to each other.

* * * * *